US010797601B2

(12) United States Patent
Glaser et al.

(10) Patent No.: US 10,797,601 B2
(45) Date of Patent: Oct. 6, 2020

(54) CURRENT PULSE GENERATOR WITH INTEGRATED BUS BOOST CIRCUIT

(71) Applicant: Efficient Power Conversion Corporation, El Segundo, CA (US)

(72) Inventors: John S. Glaser, Niskayuna, NY (US); Stephen L. Colino, Bear, DE (US)

(73) Assignee: Efficient Power Conversion Corporation, El Segundo, CA (US)

( * ) Notice: Subject to any disclaimer, the term of this patent is extended or adjusted under 35 U.S.C. 154(b) by 0 days.

(21) Appl. No.: 16/515,239

(22) Filed: Jul. 18, 2019

(65) Prior Publication Data

US 2020/0028436 A1     Jan. 23, 2020

Related U.S. Application Data

(60) Provisional application No. 62/699,990, filed on Jul. 18, 2018.

(51) Int. Cl.
*H02M 3/158* (2006.01)
*H03K 5/02* (2006.01)
*H02M 1/42* (2007.01)

(52) U.S. Cl.
CPC ....... *H02M 3/1584* (2013.01); *H02M 1/4225* (2013.01); *H02M 3/158* (2013.01); *H03K 5/02* (2013.01); *H02M 2003/1586* (2013.01)

(58) Field of Classification Search
CPC ................ H02M 3/158; H02M 2003/1557
See application file for complete search history.

(56) References Cited

U.S. PATENT DOCUMENTS

| | | | | |
|---|---|---|---|---|
| 5,089,727 A | * | 2/1992 | Molitor | H03K 17/6877 307/108 |
| 6,710,646 B1 | * | 3/2004 | Kimball | H03F 1/0222 330/10 |
| 9,413,244 B2 | | 8/2016 | Chen | |
| 9,525,413 B2 | | 12/2016 | Roberts et al. | |
| 9,929,652 B1 | | 3/2018 | Ribarich et al. | |
| 2013/0313996 A1 | * | 11/2013 | Williams | H05B 47/10 315/291 |
| 2014/0070627 A1 | * | 3/2014 | Briere | H03K 17/102 307/113 |

(Continued)

OTHER PUBLICATIONS

P.K. Bhadani, "Capacitor-charging power supply for laser pulsers using a boost circuit," Review of Scientific Instruments, vol. 60, No. 4, Apr. 1989, pp. 605-607.

*Primary Examiner* — Harry R Behm
(74) *Attorney, Agent, or Firm* — Blank Rome LLP

(57) ABSTRACT

A current pulse generator circuit configured to be monolithically integrated into a single semiconductor die and provide high pulsing frequencies. A first GaN FET transistor controls the charging of a capacitor in a boost converter. A second GaN FET transistor controls the discharging of the capacitor through a load, such as a laser diode, connected to the boost converter. Both GaN FET transistors are preferably enhancement mode GaN FETs and may be integrated into the single semiconductor die, together with gate drivers. The diode in a conventional boost converter circuit can also be implemented in the present invention as a GaN FET transistor, and also integrated into the single semiconductor die.

8 Claims, 10 Drawing Sheets

(56) References Cited

U.S. PATENT DOCUMENTS

| | | | |
|---|---|---|---|
| 2015/0115813 A1* | 4/2015 | Hussain | G09G 3/3406 |
| | | | 315/186 |
| 2015/0340950 A1* | 11/2015 | Wibben | H05B 45/10 |
| | | | 323/288 |
| 2017/0055320 A1* | 2/2017 | Somarowthu | H05B 45/48 |
| 2017/0365979 A1* | 12/2017 | Van Der Tempel | H02M 3/158 |
| 2018/0267152 A1* | 9/2018 | McMichael | G01S 17/14 |
| 2018/0278011 A1* | 9/2018 | Galvano | G01S 7/4813 |

\* cited by examiner

CURRENT PULSE GENERATOR WITH INTEGRATED BUS BOOST CIRCUIT

This application claims the benefit of U.S. Provisional Application No. 62/699,990, filed on Jul. 18, 2018, the entire disclosure of which is hereby incorporated by reference.

BACKGROUND

1. Field of the Invention

The present invention relates generally to power current pulse generators, and more particularly to a boost converter with higher pulsing frequencies and a smaller form factor.

2. Description of the Related Art

Typical current pulse generator circuits include a storage capacitor, a load, and a discharge device, which may be implemented with a semiconductor device such as a transistor. The storage capacitor stores electrical energy, and the discharge device controls current supplied by the capacitor to the load. The energy stored in the capacitor may be controlled or limited by impedance in the current loop formed by the capacitor, discharge device, and load. To generate high energy pulses from the capacitor to the load, the capacitor is often charged to a higher voltage than is available from a power supply connected to the pulse generator. To charge the capacitor to such a high voltage, the circuit, termed a boost converter, includes an inductor to store energy from the lower voltage power supply and transfers this energy to the capacitor. The storage of energy in the inductor and the transfer of that energy to the capacitor is controlled by switches, typically transistors acting as switches.

FIGS. 1A-B illustrate schematics of conventional boost converters and current pulse generators. In FIG. 1A, conventional boost converter 100 includes a voltage source 105, a first inductor 110, a diode 120, a capacitor 130, a second inductor 140, a load 135, and two switches: charging switch 115 and driving switch 125.

When charging switch 115 is closed and driving switch 125 is open, current increases through inductor 110. When charging switch 115 is opened, energy from inductor 110 charges capacitor 130 through diode 120. The stored energy in inductor 110 allows capacitor 130 to be charged beyond the source voltage. When charging switch 115 is open and driving switch 125 is closed, capacitor 130 discharges through inductor 140 and load 135. Diode 120, between the charging switch 115 and capacitor 130, prevents capacitor 130 from discharging while charging switch 115 is closed. This prevents capacitor 130 from completely discharging and in turn enables boost converter 100 to recharge capacitor 130 more quickly and pulse more frequently. This is a useful feature where capacitor 130 has a high capacitance and takes a long time to charge.

In FIG. 1B, conventional boost converter 150 includes a voltage source 155, an inductor 160, a diode 170, a transistor 175, a capacitor 180, and a load 190, which, in this example, is a laser diode depicted as a resistor 194 and a diode 198. Transistor 175 acts as a switch, such as charging switch 115 in boost converter 100. In some implementations, a very specific amount of energy and current must be supplied from capacitor 180 to load 190, which requires careful control of the energy stored in capacitor 180. Diode 170, between inductor 160 and transistor 175, causes capacitor 180 to discharge through transistor 175, resetting the voltage on capacitor 180 to a standard initial condition and allowing finer control over the current output from capacitor 180 through load 190.

When transistor 175 acts as a closed switch, current increases in inductor 160. When transistor 175 acts as an open switch, the energy from inductor 160 charges capacitor 180 through diode 170. The stored energy in inductor 160 allows capacitor 180 to be charged beyond the source voltage. In turn, the charged capacitor discharges through load 190.

Some implementations of boost converters 100 and 150 must meet particular size and pulse frequency constraints. For example, in a light detection and ranging (lidar) system, smaller laser drivers allow more lasers to be implemented in a smaller area, which simplifies alignment of optical components such as lenses. However, the switching transistors must be able to withstand the higher voltages and currents through the boost converters, which may require larger area power transistors. Conventional vertical power metal oxide semiconductor field effect transistors (MOSFET) cannot be integrated on the same semiconductor die as the associated gate drivers, thus necessitating two distinct semiconductor die for the circuit. This severely limits how small a pulse generator with conventional MOSFET power transistors can be made. Similarly, more frequent, smaller, and accurate pulses enable higher frame rates and better distance resolution for the lidar system, but the switching speed of silicon-based transistors is limited.

SUMMARY OF THE INVENTION

The present invention addresses the disadvantages of conventional boost converters and current pulse generators, discussed above, by providing a boost converter circuit incorporated with gallium nitride (GaN) FET transistor switches, which may be monolithically integrated into a single semiconductor die with the corresponding gate drivers, reducing the area of the current pulse generator. The high switching speeds of the GaN FETs included in the present invention also provide a boost converter circuit with the capability to operate at an increased pulse frequency.

The present invention, as described herein, comprises a first gate driver circuit connected to a GaN FET, which controls the charging of a capacitor in a boost converter. A second gate driver circuit is connected to a second GaN FET transistor, which controls the discharging of the capacitor through a load connected to the boost converter. Both GaN FET transistors are preferably enhancement mode GaN FETs and may be integrated into a single semiconductor chip in combination with the first and second gate driver circuits. The diode in a conventional boost converter circuit can also be implemented in the present invention as a GaN FET transistor, which is also integrated into the single semiconductor chip in combination with its gate driver circuit. As a result, the entire current pulse generator circuit of the present invention can advantageously be integrated in a single semiconductor die.

In a further embodiment, the circuit comprises only a single GaN FET transistor which controls both the charging and the discharging of the capacitor in a combination of boost converter and power current pulse generator.

The above and other preferred features described herein, including various novel details of implementation and combination of elements, will now be more particularly described with reference to the accompanying drawings and pointed out in the claims. It should be understood that the particular methods and apparatuses are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The features, objects, and advantages of the present disclosure will become more apparent from the detailed description set forth below when taken in conjunction with the drawings in which like reference characters identify correspondingly throughout and wherein.

DETAILED DESCRIPTION OF THE PREFERRED EMBODIMENTS

In the following detailed description, reference is made to certain embodiments. These embodiments are described with sufficient detail to enable those skilled in the art to practice them. It is to be understood that other embodiments may be employed and that various structural, logical, and electrical changes may be made. The combinations of features disclosed in the following detailed description may not be necessary to practice the teachings in the broadest sense, and are instead taught merely to describe particularly representative examples of the present teachings.

Figure 1A:
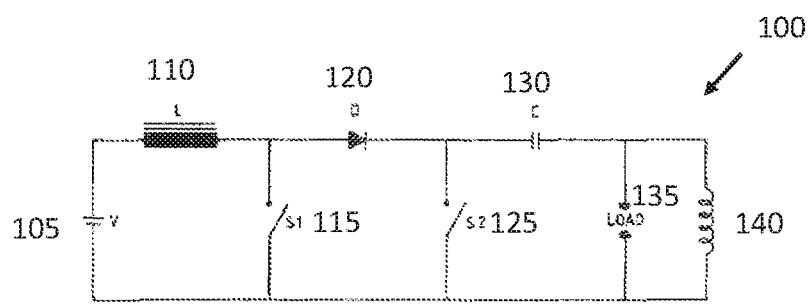
FIGS. 1A-B illustrate schematics of conventional boost converter and current pulse generator circuits.
Figure 1B:
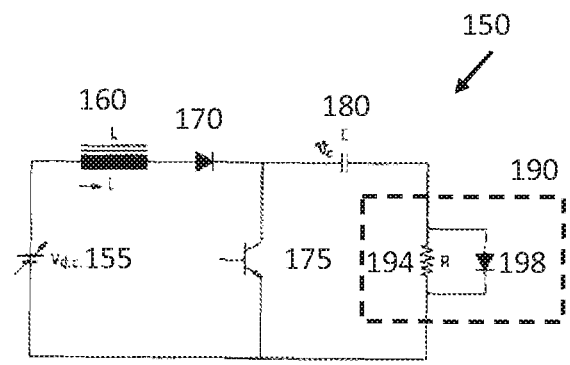
Figure 2:
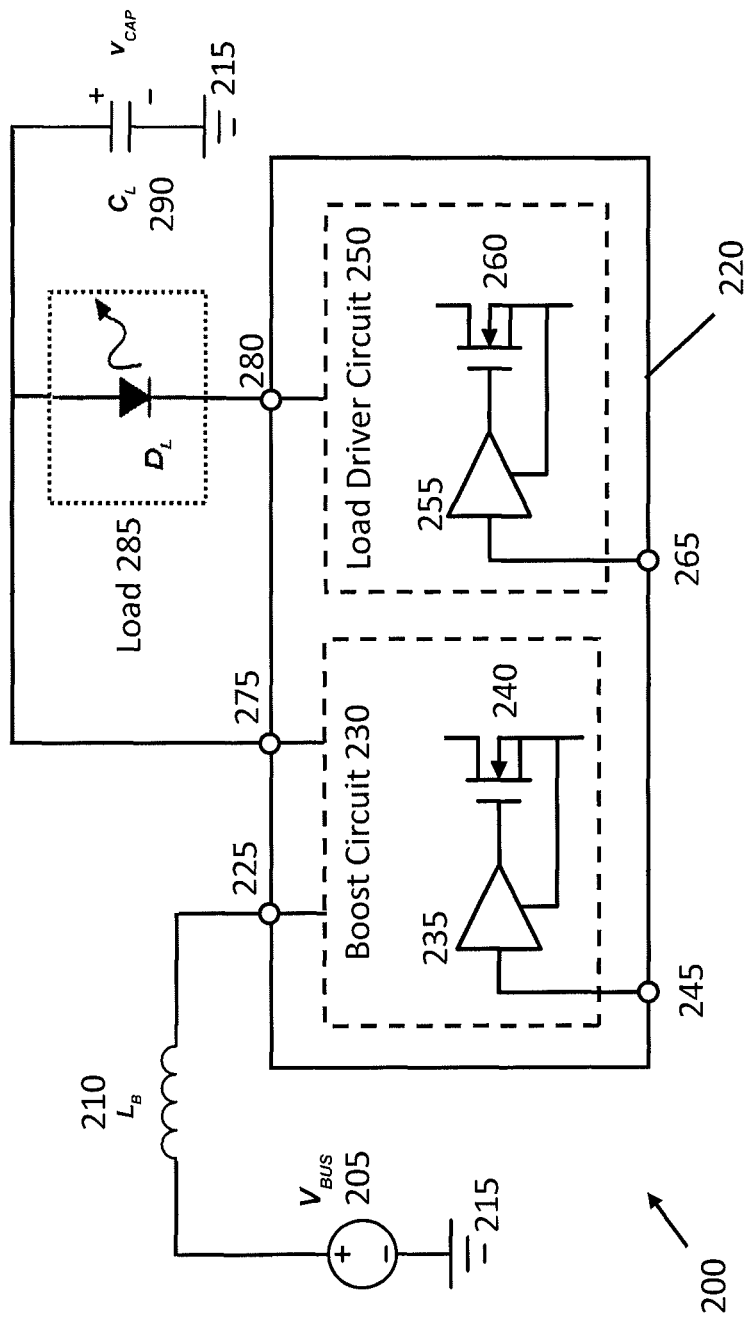
FIG. 2 illustrates a current pulse generator with voltage boost circuitry according to an exemplary embodiment of the present invention, incorporating two GaN FETs, one controlling the charging of a capacitor, the other controlling the discharging of the capacitor through a load.

FIG. 2 illustrates a current pulse generator 200 according to an exemplary embodiment of the present invention, with GaN FET transistors integrated into a single monolithic chip 220. Monolithic integration of boost circuit 230 and load driver circuit 250 onto a single semiconductor die 220 greatly reduces the area of current pulse generator 200. Pulse generator 200 is similar to the boost converters and current pulse generators shown in FIGS. 1A-1B, and includes a voltage source 205, an inductor 210, a current pulse generator circuit integrated into a single semiconductor die 220, a load 285, and a capacitor 290. In this example, load 285 includes a laser diode $D_L$, but any appropriate load may be used.

Pulse generator chip 220 includes a boost circuit 230 and a load driver circuit 250. Boost circuit 230 includes a charging transistor 240 and a corresponding gate driver 235, which control the charging of capacitor 290 similar to charging switch 115 shown in FIG. 1A. Boost circuit 230 receives a charging control signal at node 245, and is coupled to inductor 210 at input node 225 and to load 285 and capacitor 290 at output node 275. In some embodiments, boost circuit 230 includes other uncontrolled switches acting as diodes, or other optional regulation circuits. Load driver circuit 250 controls the pulsing of current pulse generator 200, and includes a driving transistor 260 and a corresponding gate driver 255. Load driver transistor 260 and corresponding gate driver circuit 255 control the discharging of energy in capacitor 290 to load 285 similar to driving switch 125 shown in FIG. 1A. Load driver circuit 250 receives a load driver control signal at node 265, and is coupled to load 285 at load driving node 280.

Transistors 240 and 260 are preferably enhancement mode GaN FET semiconductor devices, which are monolithically integrated with their gate drivers 235 and 255, respectively, onto a single semiconductor die 220. Because GaN FETs are able to carry large currents, support high voltages, and switch more quickly than conventional transistors, transistors 240 and 260 enable pulse generator 200 to provide higher pulsing frequencies than a similar pulse generator implementing other power transistors, such as power MOSFETs.

Voltage source 205 is coupled to inductor 210, which is further coupled to current pulse generator circuit 220 and boost circuit 230 at input node 225. Inductor 210 acts as the boost inductor, and stores energy in order to charge capacitor 290 to higher voltages than voltage source 205 alone can provide. Load 285 is coupled to capacitor 290 and boost circuit 230 in current pulse generator circuit 220 at output node 275, and coupled to pulse generator circuit 220 and load driver circuit 250 in pulse generator circuit 220 at load driving node 280. Capacitor 290 has a capacitance value $C_L$, and the voltage on capacitor 230 is represented as $V_{CAP}$. Capacitor 290 is coupled to ground 215, and stores the pulse energy to be provided to load 285.

Employing GaN FET transistors 240 and 260 in the circuit of the present invention allows power and signal level components to be combined on a single die, because the corresponding gate driver circuits 235 and 255 may be monolithically integrated with transistors 240 and 260.

When charging transistor 240 acts as a closed switch and driving transistor 260 acts as an open switch, energy is stored in inductor 210 from voltage source 205. When charging transistor 240 acts as an open switch, energy stored in inductor 210 from voltage source 205 charges capacitor 290. The stored energy in inductor 210 allows capacitor 290 to be charged to higher voltages than the source voltage alone could provide. When charging transistor 240 acts as an open switch and driving transistor 260 acts as a closed switch, capacitor 290 discharges through load 285 and driving transistor 260.

Although, in current pulse generator 200, capacitor 290 is connected to ground, it may instead be coupled to any fixed voltage supply, including the same voltage supply to which inductor 210 is coupled, voltage source 205. For implementations in which capacitor 290 is coupled to voltage source 205, the voltage across load 285 in response to driving transistor 260 acting as an open switch is $V_{BUS}+V_{CAP}$. This boosts the voltage across load 285 during initial turn-on compared to implementations in which capacitor 290 is coupled to ground. Because voltage source 205 has no alternating current component, coupling capacitor 290 to it does not affect the resonant behavior of current pulse generator 200. This may act as a clamp for the charge and discharge cycles of capacitor 290.

Pulse generator 200 can be operated in a variety of operation modes based on the boost control signal applied to gate driver 235 at boost control input node 245. For example, in one mode of operation, the boost control signal may comprise a continuous series of pulses of fixed or variable width in order to supply a controlled average power to capacitor 290 and maintain an approximately constant voltage $V_{CAP}$. In another mode of operation, the boost control signal may comprise a finite number of pulses of fixed or variable width in order to charge capacitor 290 to a desired voltage, after which driving transistor 260 acts as a closed switch and drives load 285 using the energy stored in charged capacitor 290.

Figure 3:
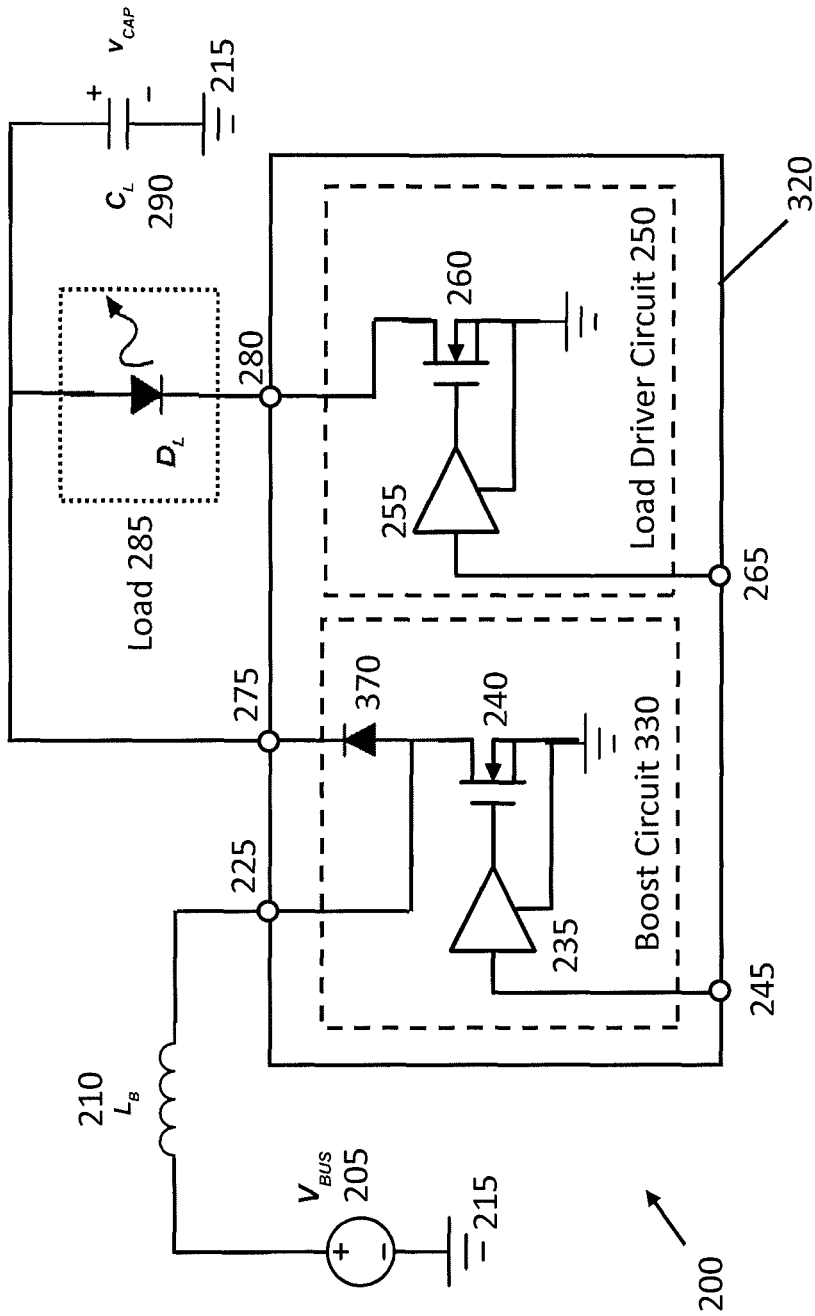
FIG. 3 illustrates a current pulse generator with voltage boost circuitry according to a first embodiment of the present invention.

FIG. 3 illustrates a schematic of a boost circuit 330 according to an exemplary embodiment of the present invention. Boost circuit 330 is one embodiment of boost circuit 230 shown in current pulse generator 200 in FIG. 2, and includes a diode 370 to prevent capacitor 290 from discharging while charging transistor 240 is closed. As discussed previously with reference to FIG. 1A, this prevents capacitor 290 from completely discharging and speeds recharging of capacitor 290. The drain terminal of charging transistor 240 is connected to input node 225 and diode 370, which is further connected to output node 275, and may be monolithically integrated into the semiconductor die of pulse generator circuit 320 alongside the rest of boost circuit 330 and load driving circuit 250.

Transistors 240 and 260, their corresponding gate drivers 235 and 255, respectively, and diode 370 can be integrated on a single semiconductor die 320, allowing a logic level control signal to control the power charging transistor 240. Pulse generator 200 can be customized for a particular inductor charging time, inductor value, and capacitance value to control the stored energy and desired $V_{CAP}$ according to the particular implementation and load 285. Diode 370 prevents capacitor 290 from discharging while charging transistor 240 is closed, which prevents capacitor 290 from completely discharging while charging transistor 240 acts as a closed switch. This allows pulse generator 200 to recharge capacitor 290 more quickly and pulse again sooner, increasing the pulsing frequency.

Figure 4:
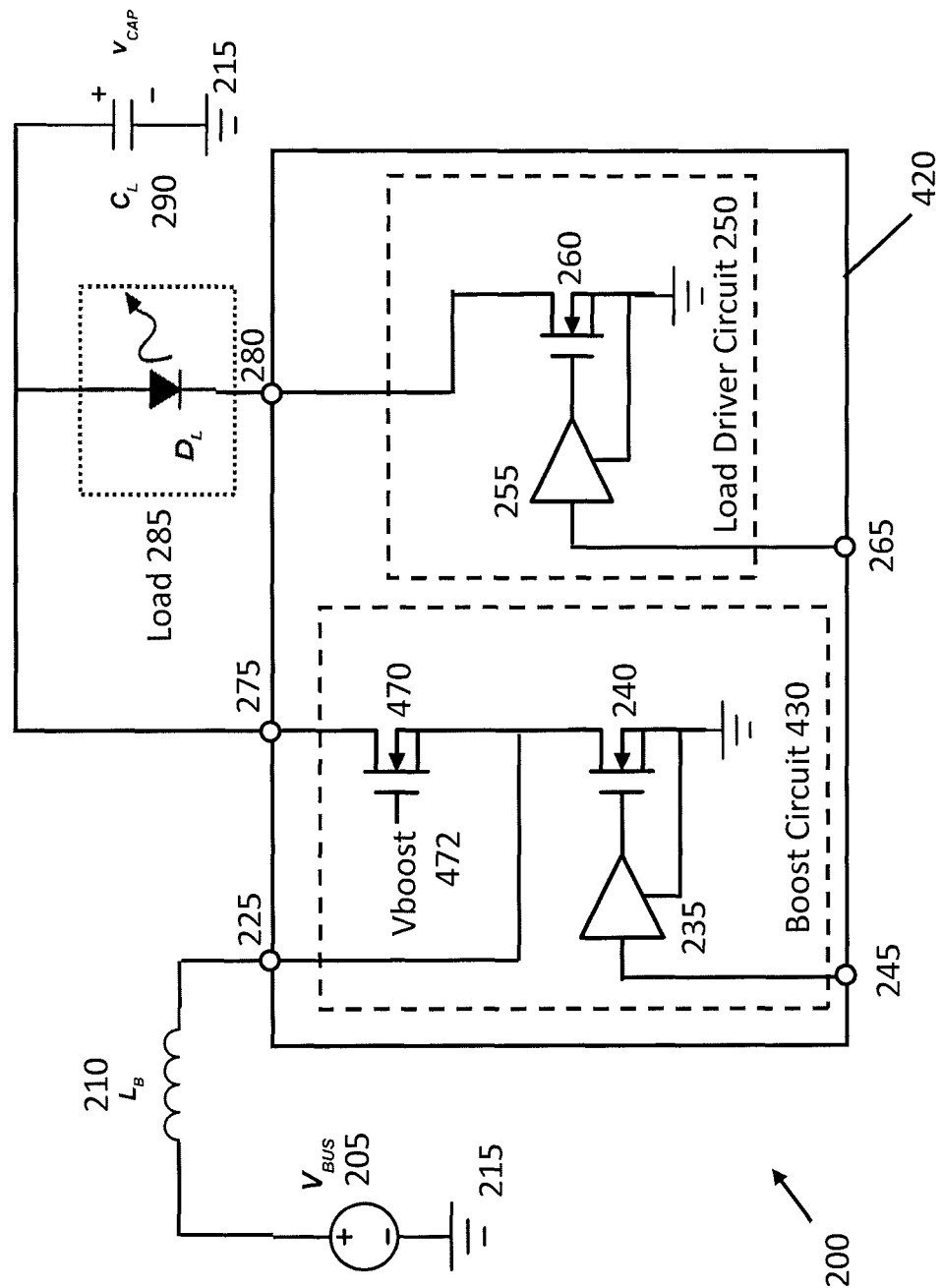
FIG. 4 illustrates a current pulse generator with voltage boost circuitry with synchronous rectification to reduce power consumption.

FIG. 4 illustrates a schematic of a boost circuit 430, which is a variation of boost circuit 330 shown in FIG. 3. Boost circuit 430 is similar to boost circuit 330, but includes an enhancement mode GaN FET transistor 470 in place of diode 370. Transistor 470 implements synchronous rectification and reduces the voltage drop across transistor 470 compared to diode 370, increasing the efficiency of boost circuit 430 and reducing power dissipated as heat. The reduced power consumption is particularly beneficial in implementations using a battery as a voltage source and in implementations with temperature constraints.

The source terminal of transistor 470 is coupled to input node 225 and the drain terminal of charging transistor 240. The drain terminal of transistor 470 is coupled to output node 275. The gate terminal of transistor 470 is coupled to a gate driver circuit, not shown, and receives a boost control voltage $V_{BOOST}$ 472. Transistor 470 and its corresponding gate driver circuit is preferably monolithically integrated with transistors 240 and 260 and their corresponding gate driver circuits into a single semiconductor die 420.

Figure 5:
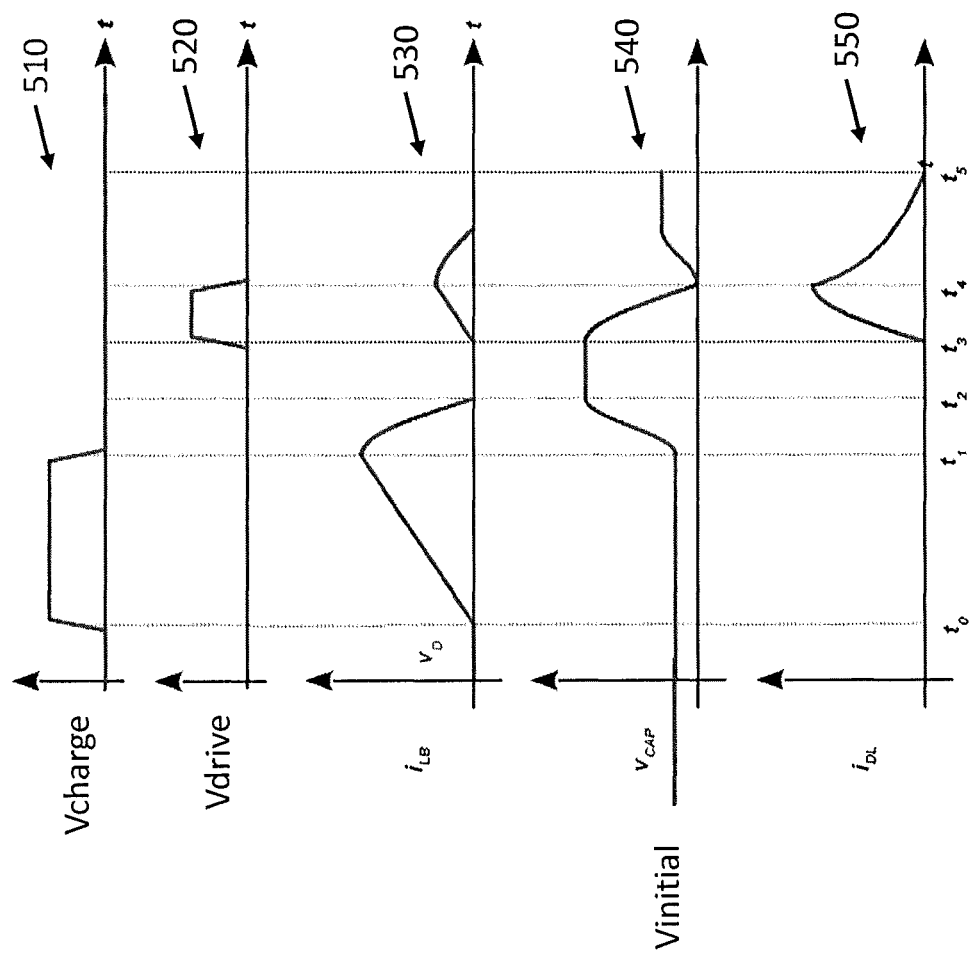
FIG. 5 illustrates a set of graphs of GaN FET driver voltages, capacitor voltage, and current through an inductor and a load for the current pulse generator circuits shown in FIGS. 3 and 4.

FIG. 5 is a set of graphs showing GaN FET driver voltages, capacitor voltage, and current through an inductor and a load for current pulse generator 200 including the boost circuit embodiment 330 shown in FIG. 3 or its variant embodiment 430 shown in FIG. 4. Graph 510 shows the drive voltage $V_{CHARGE}$ for charging transistor 240. Graph 520 shows the drive voltage $V_{DRIVE}$ for driving transistor 260. Graph 530 shows the current through inductor 210. Graph 540 shows the voltage $V_{CAP}$ on capacitor 290. Graph 550 shows the current through load 285. At time $t_0$, $V_{CHARGE}$ increases and causes charging transistor 240 to act as a closed switch, and $V_{DRIVE}$ causes driving transistor 260 to act as an open switch. The voltage $V_{CAP}$ on capacitor 290 is at an initial voltage, $V_{INITIAL}$, and no current flows through load 285.

The current through inductor 210 increases until time $t_1$, when $V_{CHARGE}$ decreases and causes charging transistor 240 to act as an open switch. This causes the current through inductor 210 to decrease and charge capacitor 290, increasing the voltage $V_{CAP}$ on capacitor 290 until time $t_2$, when no current flows through inductor 210 and the voltage $V_{CAP}$ on capacitor 290 plateaus. At time $t_3$, $V_{DRIVE}$ increases and causes driving transistor 260 to act as a closed switch, discharging the voltage $V_{CAP}$ on capacitor 290 and causing current to flow through load 285 and through inductor 210. At time $t_4$, the voltage $V_{CAP}$ on capacitor 290 has decreased to zero, and current through inductor 210 and through load 285 starts to decrease. This causes the inductor to charge the voltage $V_{CAP}$ on capacitor 290 to the initial condition voltage $V_{INITIAL}$.

Figure 6:
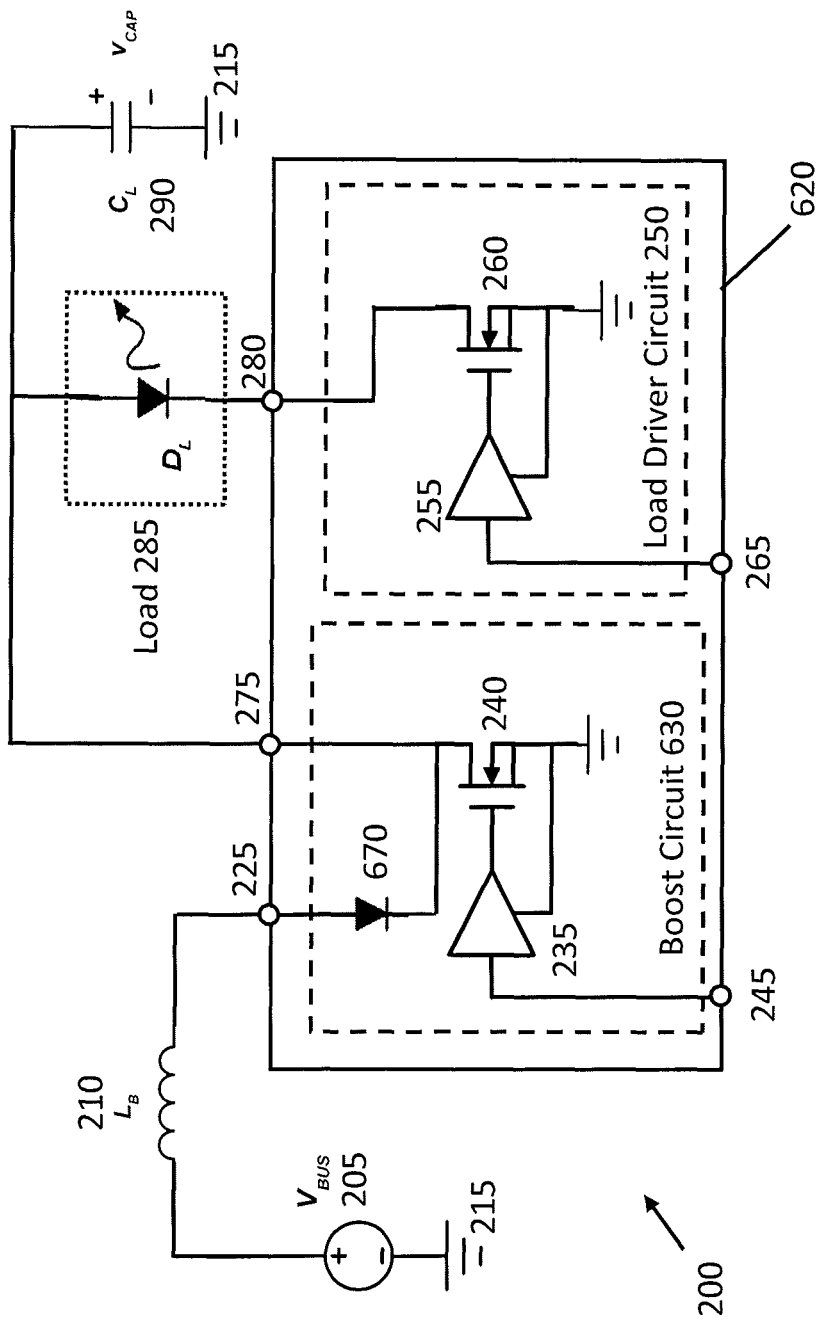
FIG. 6 illustrates a current pulse generator with voltage boost circuitry in which the diode is positioned to cause the capacitor to discharge through the charging transistor when the charging transistor is closed.

FIG. 6 illustrates a schematic of a boost circuit 630 according to a further embodiment of the present invention. Boost circuit 630 is a further embodiment of boost circuit 230 shown in current pulse generator 200 shown in FIG. 2, and includes a diode 670 to cause capacitor 290 to discharge through charging transistor 240 when charging transistor 240 acts as a closed switch. As discussed previously with reference to FIG. 1B, this resets the voltage $V_{CAP}$ on capacitor 290 to a standard initial condition and allows finer control over the current output from capacitor 290 to load 285. Diode 670 is coupled to input node 225, and to output node 275 and the drain terminal of charging transistor 240.

Transistors 240 and 260, their corresponding gate driver circuits 235 and 255, respectively, and diode 670 are preferably integrated on a single semiconductor die 620, combining power and signal level components on a single die. The resulting pulse generator 200 can be customized for a particular inductor charging time, inductor value, and capacitance value to control the stored energy and desired $V_{CAP}$ according to the particular implementation and load 285. Diode 670 is positioned between inductor 210 and charging transistor 240, causing capacitor 290 to discharge through charging transistor 240 when charging transistor 240 acts as a closed switch. This resets voltage $V_{CAP}$ on capacitor 290 to a standard initial condition and allows finer control over the current output from capacitor 290 through load 285.

Figure 7:
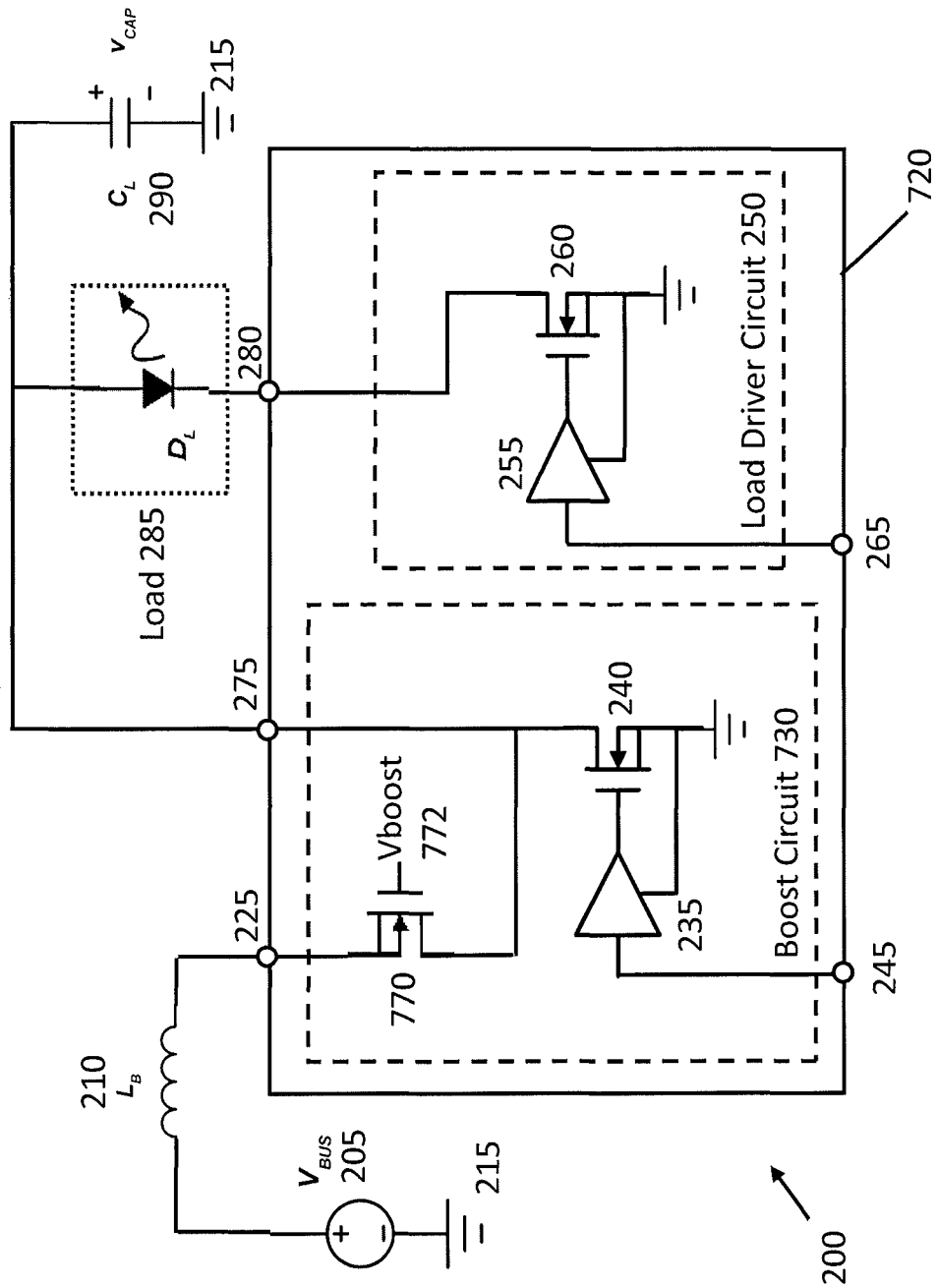
FIG. 7 illustrates a current pulse generator with the voltage boost circuitry of FIG. 6 and the synchronous rectification circuitry of FIG. 4.

FIG. 7 is a schematic of a further embodiment of the present invention with a boost circuit 730, which is a variation of boost circuit 630 shown in FIG. 6. Boost circuit 730 is similar to boost circuit 630, but includes an additional enhancement mode GaN FET transistor 770 in place of diode 670. Transistor 670 implements synchronous rectification as in the embodiment of FIG. 4, reducing the voltage drop across transistor 770 compared to diode 670, increasing the efficiency of boost circuit 630 and reducing power dissipated as heat. The source terminal of transistor 770 is coupled to input node 225, and the drain terminal of transistor 770 is coupled to the drain terminal of charging transistor 240 and output node 275. The gate terminal of transistor 770 is coupled to a gate driver circuit, not shown, and receives a boost control voltage $V_{BOOST}$ 772. Transistor 770 and its corresponding gate driver circuit are preferably monolithically integrated with transistors 240 and 260 and their corresponding gate driver circuits 235 and 255 into a single semiconductor die 720.

Figure 8:
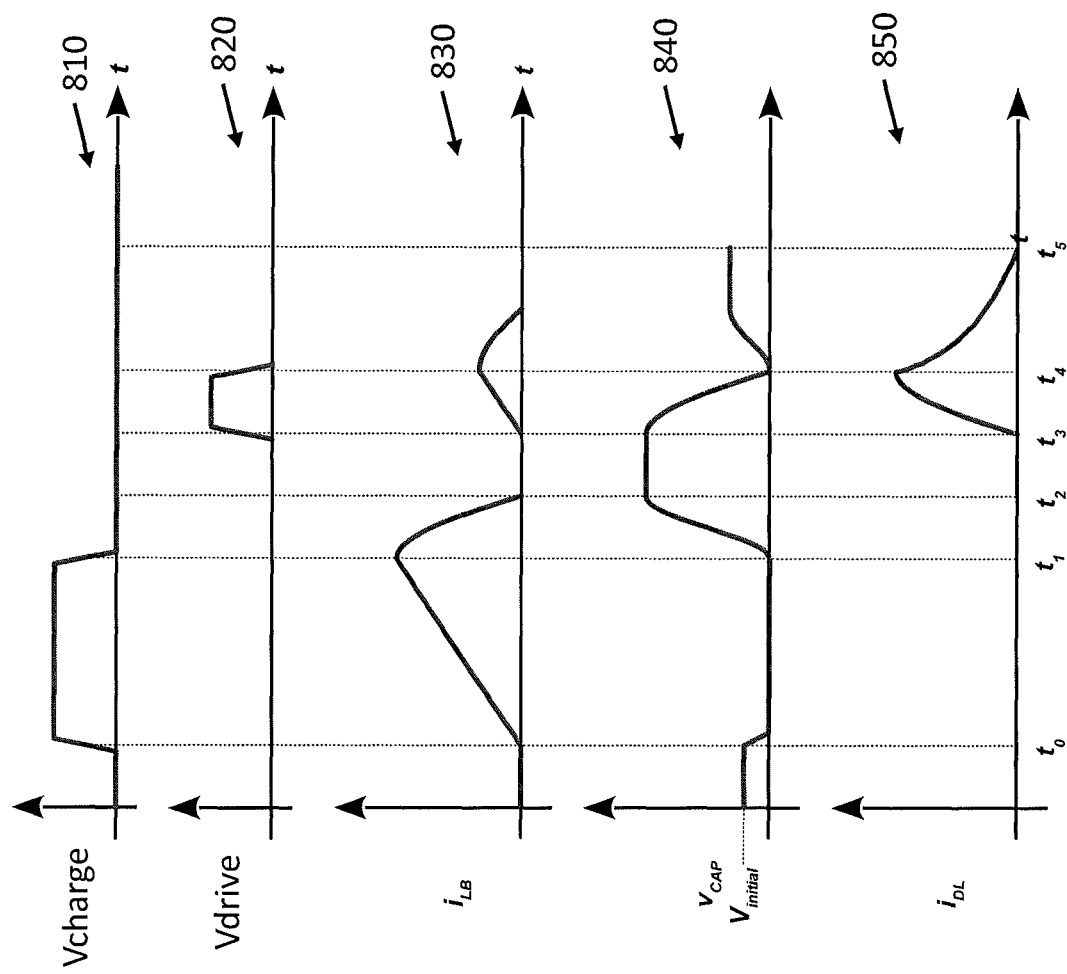
FIG. 8 illustrates a set of graphs of GaN FET driver voltages, capacitor voltage, and current through an inductor and a load for the boost circuits and current pulse generators shown in FIGS. 6 and 7.

FIG. 8 illustrates a set of graphs of GaN FET driver voltages, capacitor voltage, and current through an inductor and a load for current pulse generator 200 including the boost circuit embodiment 630 shown in FIG. 6 or its variant embodiment 730 shown in FIG. 7. Graph 810 shows the drive voltage $V_{CHARGE}$ for charging transistor 240. Graph 820 shows the drive voltage $V_{DRIVE}$ for driving transistor 260. Graph 830 shows the current through inductor 210. Graph 840 shows the voltage $V_{CAP}$ on capacitor 290. Graph 850 shows the current through load 285. At time $t_0$, $V_{CHARGE}$ increases and causes charging transistor 240 to act as a closed switch, and $V_{DRIVE}$ causes driving transistor 260 to act as an open switch. The voltage $V_{CAP}$ on capacitor 290 is at an initial voltage, $V_{INITIAL}$, and no current flows through load 285. In response to charging transistor 240 acting as a closed switch, the voltage $V_{CAP}$ on capacitor 290 decreases to zero from the initial voltage.

The current through inductor 210 increases until time $t_1$, when $V_{CHARGE}$ decreases and causes charging transistor 240 to act as an open switch. This causes the current through inductor 210 to decrease and charge capacitor 290, increasing the voltage $V_{CAP}$ on capacitor 290 until time $t_2$, when no current flows through inductor 210 and the voltage $V_{CAP}$ on capacitor 290 plateaus. At time $t_3$, $V_{DRIVE}$ increases and causes driving transistor 260 to act as a closed switch, discharging the voltage $V_{CAP}$ on capacitor 290 and causing current to flow through load 285 and through inductor 210. At time $t_4$, the voltage $V_{CAP}$ on capacitor 290 has decreased to zero, and current through inductor 210 and through load 285 starts to decrease. This causes the inductor to charge the voltage $V_{CAP}$ on capacitor 290 to the initial condition voltage $V_{INITIAL}$.

Figure 9:
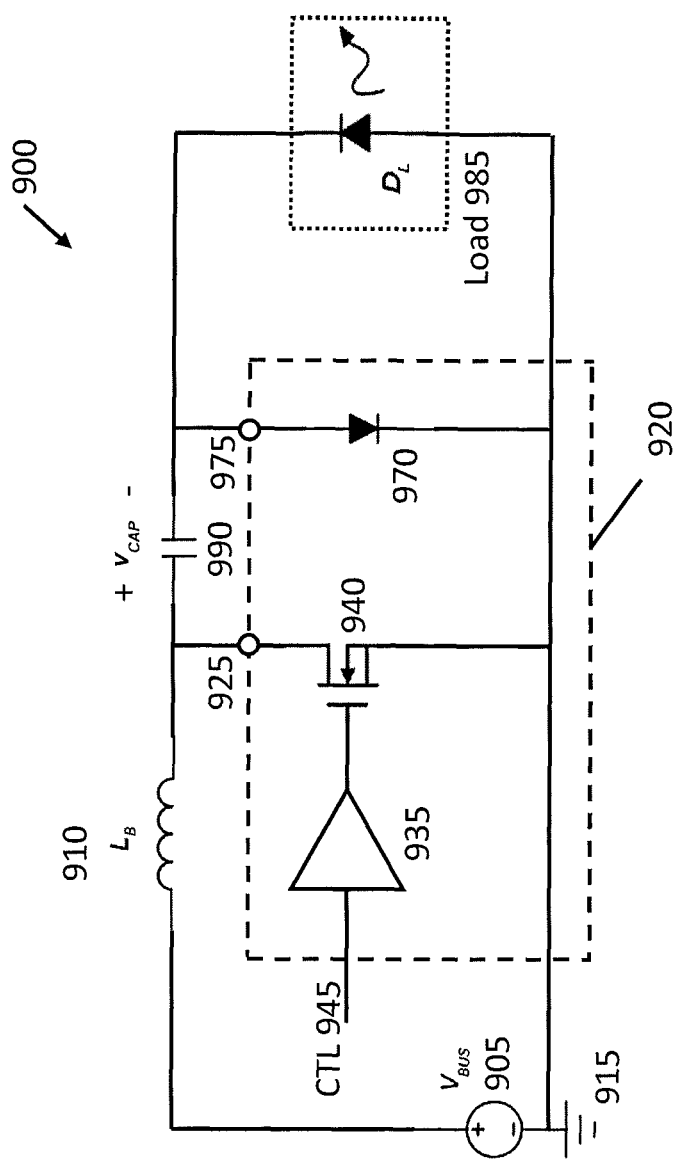
FIG. 9 illustrates an embodiment of the present invention including a current pulse generator with a GaN FET transistor acting as both the charging switch and the driving switch.

FIG. 9 illustrates a schematic of a boost converter 900 according to a further embodiment of the present invention. Boost converter 900 includes a voltage source 905, an inductor 910, a diode 970, a capacitor 990, a load 985, and a power current pulse generator circuit 920, which includes a transistor 940 and its corresponding gate driver circuit 935. Transistor 940 is an enhancement mode GaN FET. Voltage source 905 is coupled to inductor 910, which is further coupled to pulse generator circuit 920 and a drain terminal of transistor 940 and capacitor 990 at input node 925. The source terminal of transistor 940 is coupled to ground 915, and the gate terminal of transistor 940 is coupled to gate driver circuit 935, which receives a control signal CTL 945. Capacitor 990 is a floating capacitor in this example, and is further coupled to diode 970 and load 985, which are further coupled to ground 915.

Although diode 970 is shown as a diode, an additional enhancement mode GaN FET may be substituted to implement synchronous rectification. Diode 970, transistor 940, and gate driver circuit 945 are preferably monolithically integrated into a single semiconductor die 920. In boost converter 900, transistor 940 acts as both the charging transistor and the driving transistor.

Figure 10:
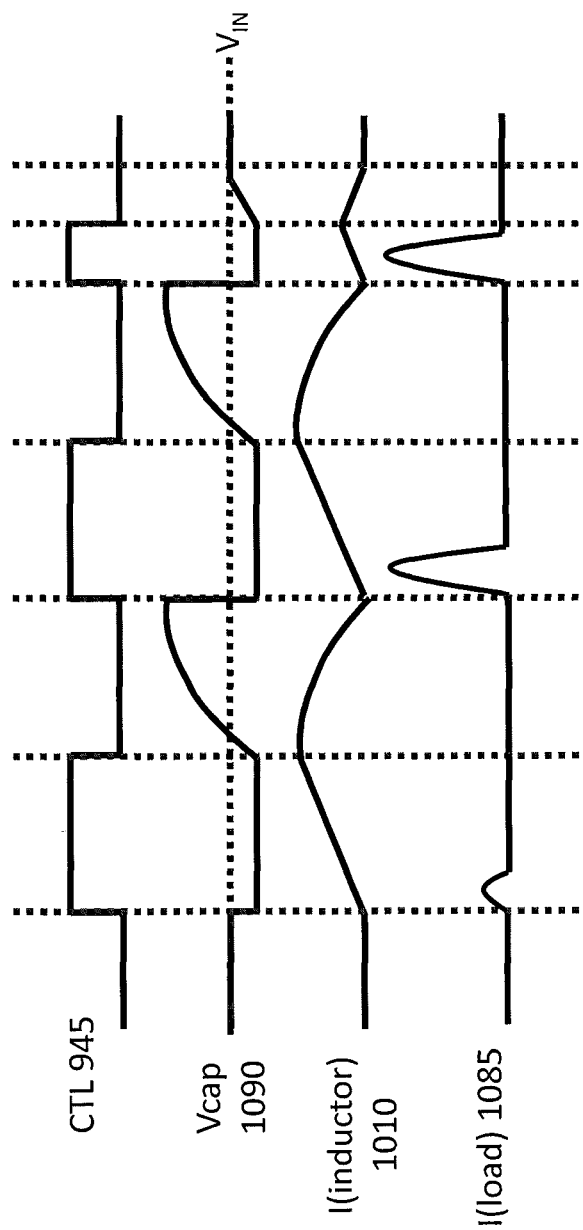
FIG. 10 illustrates a set of graphs of a gate driver control signal, capacitor voltage, and current through an inductor and a load for the current pulse generator shown in FIG. 9.

FIG. 10 illustrates a set of graphs showing the control signal CTL 945, the voltage $V_{CAP}$ 1090 on capacitor 990, the current 1010 through inductor 910, and the current 1085 through load 985 in boost converter 900 in FIG. 9. When CTL 945 causes transistor 940 to act as a closed switch, the voltage $V_{CAP}$ 1090 decreases, causing current 1085 to flow through load 985, and current 1010 through inductor 910 increases, causing inductor 910 to store energy from voltage source 905. When CTL 945 causes transistor 940 to act as an open switch, current 1010 through inductor 910 decreases as voltage source 905 and inductor 910 charge capacitor 990, increasing the voltage $V_{CAP}$ 1090 on capacitor 990. When CTL 945 causes transistor 940 to act as a closed switch again, capacitor 990 discharges through load 985, decreasing voltage $V_{CAP}$ 1090 on capacitor 990 and causing a pulse in current 1085 through load 985. Current 1010 through inductor 910 increases, causing inductor 910 to store energy from voltage source 905.

The above description and drawings are only to be considered illustrative of specific embodiments, which achieve the features and advantages described herein. Modifications and substitutions to specific process conditions can be made. For example, the boost converter may be operated with a single charging pulse or multiple charging pulses, before energy stored in the capacitor is discharged into the load. Accordingly, the embodiments of the invention are not considered as being limited by the foregoing description and drawings.

What is claimed is:

1. A current pulse generator integrated circuit, comprising:
   a boost circuit connected to a boost input terminal and a boost output terminal of the integrated circuit, wherein the boost circuit comprises:
   a first gate driver circuit having an input for receiving a boost control signal; and
   a first field effect transistor (FET) having a gate terminal connected to an output of the first gate driver circuit, a drain terminal, and a source terminal connected to ground;
   a synchronous rectifier connected to the boost input terminal of the integrated circuit and to the drain terminal of the first FET; and
   a load driver circuit connected to a load driver terminal of the integrated circuit, wherein the load driver circuit comprises:
   a second gate driver circuit having an input for receiving a load driver control signal; and
   a second FET having a gate terminal connected to an output of the second gate driver circuit, a drain terminal connected to the load driver terminal of the integrated circuit, and a source terminal connected to ground;
   wherein the synchronous rectifier comprises a third FET having a gate terminal connected to a boost control voltage, a source terminal connected to the boost input terminal of the integrated circuit, and a drain terminal connected to the boost output terminal of the integrated circuit and to the drain terminal of the first FET, and
   wherein both the boost circuit and the load driver circuit are monolithically integrated together on a single semiconductor die to form the integrated circuit.

2. The current pulse generator integrated circuit of claim 1, wherein the first and second FETs are enhancement mode gallium nitride field effect transistors.

3. A pulse generator device, comprising:
the current pulse generator integrated circuit of claim 1;
a voltage source;
an inductor connected between the voltage source and the boost input terminal;
a capacitor connected to the boost output terminal; and
a load connected to the boost output terminal and the load driver terminal of the integrated circuit.

4. A boost converter circuit, comprising:
a current pulse generator integrated circuit, comprising;
 a gate driver circuit having an input for receiving a control signal;
 a field effect transistor (FET) having a gate terminal connected to an output of the gate driver circuit, a drain terminal connected to a first terminal of the integrated circuit, and a source terminal; and
 a rectifying element connected to a second terminal of the integrated circuit;
 wherein the gate driver circuit, the FET, and the rectifying element of the current pulse generator integrated circuit are monolithically integrated on a single semiconductor die;
a voltage source;
an inductor connected between the voltage source and the first terminal of the current pulse generator circuit;
a capacitor having a positive terminal connected to the first terminal of the current pulse generator integrated circuit and a negative terminal connected to the second terminal of the current pulse generator integrated circuit; and
a load connected to the capacitor and the second terminal of the current pulse generator integrated circuit.

5. The boost converter circuit of claim 4, wherein the FET comprises an enhancement mode gallium nitride field effect transistor.

6. The boost converter circuit of claim 4, wherein the FET of the current pulse generator integrated circuit controls both the charging and the discharging of the capacitor.

7. The boost converter circuit of claim 4, wherein the capacitor is a floating capacitor.

8. The boost converter circuit of claim 4, wherein the load is a laser diode.

* * * * *